United States Patent
Cho et al.

(10) Patent No.: US 9,570,534 B2
(45) Date of Patent: Feb. 14, 2017

(54) ORGANIC LIGHT EMITTING DIODE DISPLAY

(71) Applicant: Samsung Display Co., Ltd., Yongin-si, Gyeonggi-do (KR)

(72) Inventors: Kyu-Sik Cho, Yongin-si (KR); Won-Kyu Lee, Yongin-si (KR); Tae-Hoon Yang, Yongin-si (KR); Byoung-Kwon Choo, Yongin-si (KR); Sang-Ho Moon, Yongin-si (KR); Bo-Kyung Choi, Yongin-si (KR); Yong-Hwan Park, Yongin-si (KR); Joon-Hoo Choi, Yongin-si (KR); Min-Chul Shin, Yongin-si (KR); Yun-Gyu Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/946,231

(22) Filed: Nov. 19, 2015

(65) Prior Publication Data
US 2016/0079338 A1    Mar. 17, 2016

Related U.S. Application Data

(62) Division of application No. 13/077,045, filed on Mar. 31, 2011, now abandoned.

(30) Foreign Application Priority Data

Jun. 30, 2010 (KR) .................. 10-2010-0062878

(51) Int. Cl.
*H01L 27/32* (2006.01)
*H01L 27/12* (2006.01)

(52) U.S. Cl.
CPC ....... *H01L 27/3279* (2013.01); *H01L 27/1248* (2013.01); *H01L 27/3262* (2013.01);
(Continued)

(58) Field of Classification Search
CPC ............. H01L 27/3279; H01L 27/3262; H01L 27/3265
See application file for complete search history.

(56) References Cited

U.S. PATENT DOCUMENTS 7,989,850 B2   8/2011   Choi
8,329,523 B2   12/2012  Choi et al.
(Continued)

FOREIGN PATENT DOCUMENTS

KR   10-2000-0023524   4/2000
KR   10-2001-0038386   5/2001
(Continued)

*Primary Examiner* — Abul Kalam
(74) *Attorney, Agent, or Firm* — Knobbe Martens Olson & Bear LLP

(57) ABSTRACT

An organic light emitting diode display includes: a substrate including a first and a second gate electrode formed over a first and a second region, respectively, a first and a second gate insulator formed on the first and the second gate electrode, respectively, a first and a second semiconductor layer formed on the first and the second gate insulator, respectively, the first semiconductor layer including a first channel region, the second semiconductor layer including a second channel region, an interlayer insulator formed over the substrate and over at least part of the first and second semiconductor layers, a first and a second etching stop layer formed over the first and second channel regions, respectively, and surrounded by the interlayer insulator, and a first and a second source electrode and a first and a second drain electrode contacting the first and the second semiconductor layer, respectively, through the interlayer insulator.

11 Claims, 8 Drawing Sheets

(52) U.S. Cl.
CPC ........ *H01L 27/3265* (2013.01); *H01L 27/124* (2013.01); *H01L 27/3244* (2013.01)

(56) References Cited

U.S. PATENT DOCUMENTS

| | | | |
|---|---|---|---|
| 8,450,733 | B2 | 5/2013 | Wang et al. |
| 2005/0179374 | A1 | 8/2005 | Kwak |
| 2005/0270434 | A1* | 12/2005 | Jung ................. G02F 1/136213 349/43 |
| 2006/0091396 | A1* | 5/2006 | Lee .................... H01L 27/3279 257/72 |
| 2006/0146210 | A1* | 7/2006 | Lim ................. G02F 1/134363 349/38 |
| 2008/0002125 | A1 | 1/2008 | Kim |
| 2010/0096634 | A1 | 4/2010 | Park et al. |
| 2011/0017999 | A1 | 1/2011 | Choi |

FOREIGN PATENT DOCUMENTS

| | | |
|---|---|---|
| KR | 10-2001-0066393 | 7/2001 |
| KR | 10-2006-0030816 | 4/2006 |
| KR | 10-2007-0068918 | 7/2007 |
| KR | 10-2008-0010865 | 1/2008 |
| KR | 10-2008-0076127 | 8/2008 |
| KR | 10-2009-0105561 | 10/2009 |
| KR | 10-2009-0131402 | 12/2009 |

* cited by examiner

ORGANIC LIGHT EMITTING DIODE DISPLAY

CROSS-REFERENCE TO RELATED APPLICATIONS

This application is a divisional of U.S. patent application Ser. No. 13/077,045, filed Mar. 31, 2011, which claims priority to and the benefit of Korean Patent Application No. 10-2010-0062878 filed in the Korean Intellectual Property Office on Jun. 30, 2010, the entire contents of which are incorporated herein by reference in their entireties.

BACKGROUND

Field

The described technology relates generally to an organic light emitting diode display capable of excluding a heat treatment process for minimizing deformation such as the shrinkage of a substrate, or the like.

Description of the Related Technology

In general, an organic light emitting diode (OLED) is a diode that electrically excites an organic compound, which emits light. Organic light emitting diodes are classified into a passive matrix type and an active matrix type, depending on a driving method of a matrix of N×M pixels. The active matrix type organic light emitting diode (AMOLED) generally has lower power consumption than the passive matrix type. The AMOLED may be more suitable to implement a large dimension, and generally has higher resolution.

Organic light emitting diodes may also be classified into a bottom emission type and a top emission type, depending on an emission method. In a bottom emission type, light emitted from an emission layer is typically emitted to the outside through a thin film transistor display panel, and in a top emission type, light emitted from the emission layer is typically emitted to the outside through a common electrode. In a top emission type, the aperture ratio is generally not influenced by signal lines and a thin film transistor.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide an organic light emitting diode display implementing low-resistance wires while preventing misalignment of a gate pattern without increasing process cost.

One aspect is an organic light emitting diode display, including: a substrate including a first region and a second region, a first gate electrode formed over the first region, a second gate electrode formed over the second region, a first gate insulator formed on the first gate electrode, a second gate insulator formed on the second gate electrode, a first semiconductor layer formed on the first gate insulator, the first semiconductor layer including a first channel region, a second semiconductor layer formed on the second gate insulator, the second semiconductor layer including a second channel region, an interlayer insulator formed over the substrate and over at least part of the first and second semiconductor layers, a first etching stop layer formed over the first channel region and surrounded by the interlayer insulator, a second etching stop layer formed over the second channel region and surrounded by the interlayer insulator, a first source electrode and a first drain electrode contacting the first semiconductor layer through the interlayer insulator, and a second source electrode and a second drain electrode contacting the second semiconductor layer through the interlayer insulator.

The first etching stop layer may be formed by patterning the interlayer insulator.

The organic light emitting diode may further include: a data line electrically connected with the first source electrode, where the data line may include a lamination structure of a silicon layer pattern injected with high-concentration impurities and a conductive layer pattern.

The organic light emitting diode display may further include: a power supply line electrically connected with the second source electrode, where the power supply line may include the lamination structure of the silicon layer pattern injected with high-concentration impurities and the conductive layer pattern.

The organic light emitting diode display may further include: a passivation layer formed over at least part of the first source electrode, the first drain electrode, the second source electrode and the second drain electrode, and an auxiliary power supply line formed on the passivation layer and electrically connected with the power supply line through the passivation layer.

The organic light emitting diode display may further include: pixel electrode material layer patterns formed on the auxiliary power supply line.

The organic light emitting diode display may further include: a passivation layer formed over at least part of the first source electrode, the first drain electrode, the second source electrode and the second drain electrode, and a gate line formed over the passivation layer and electrically connected with the first gate electrode through the passivation layer and further through the first gate insulator.

The organic light emitting diode display may further include: a passivation layer formed over at least part of the first source electrode, the first drain electrode, the second source electrode and the second drain electrode, and a first connection wire formed on the passivation layer and electrically connected with the second gate electrode through the passivation layer and further through the second gate insulator.

The first connection wire may be electrically connected with the first drain electrode.

The organic light emitting diode display may further include: pixel electrode material layer patterns formed on the gate line, the first connection wire, and a second connection wire, respectively.

The organic light emitting diode display may further include: a passivation layer formed over at least part of the first source electrode, the first drain electrode, the second source electrode and the second drain electrode, and the second connection wire formed on the passivation layer and electrically connected with the second drain electrode through the passivation layer.

The organic light emitting diode display may further include: a pixel electrode formed on the passivation layer and electrically connected with the second connection wire.

Each of the first and second gate electrodes may include a doped or undoped amorphous silicon layer or a doped or undoped polysilicon layer.

The substrate may further include a third region, and the third region may include a lower capacitor electrode coplanar with the first gate electrode, a dielectric layer coplanar with the first gate insulator, and a first upper capacitor electrode coplanar with the first semiconductor layer.

The lower capacitor electrode may be electrically connected with the second gate electrode.

The lower capacitor electrode may include a doped or undoped amorphous silicon layer or a doped or undoped polysilicon layer.

The organic light emitting diode display may further include: a second upper capacitor electrode formed on the interlayer insulator and electrically connected with the first upper capacitor electrode.

The second upper capacitor electrode may include a lamination structure of a silicon layer pattern injected with high-concentration impurities and a metallic layer pattern.

The first region may be a switching thin film transistor region and the second region may be a driving thin film transistor region.

An exemplary embodiment provides an organic light emitting diode display that includes: a substrate including a first region and a second region; gate electrodes formed in the first and second regions of the substrate, respectively; gate insulators formed on the gate electrodes, respectively; semiconductor layers formed on the gate insulators, respectively; an interlayer insulator formed on a substrate including the semiconductor layers; etching stop layers formed in regions corresponding to channel regions of the semiconductor layers and formed by patterning the interlayer insulator; and an ohmic contact layer and a source/drain electrode formed on the interlayer insulator and electrically connected with predetermined regions of the semiconductor layers through via-holes of the interlayer insulator.

Further, the organic light emitting diode display may further include a data line electrically connected with the source electrode of the first region, wherein the data line is formed by a lamination structure of a silicon layer pattern injected with high-concentration impurities and a conductive layer pattern.

The organic light emitting diode display may further include a power supply line electrically connected with the source electrode of the second region, wherein the power supply line is formed by the lamination structure of the silicon layer pattern injected with high-concentration impurities and the conductive layer pattern.

The organic light emitting diode display may further include: a passivation layer formed on a substrate including the source/drain electrode; and a gate line formed on the passivation layer and electrically connected with the gate electrode of the first region through via-contact holes formed on the passivation layer and the gate insulator of the first region.

The organic light emitting diode display may further include: the passivation layer formed on the substrate including the source/drain electrode; and a first connection wire formed on the passivation layer and electrically connected with the gate electrode of the second region through via-contact holes formed on the passivation layer and the gate insulator of the second region.

The organic light emitting diode display may further include: the passivation layer formed on the substrate including the source/drain electrode; and a second connection wire formed on the passivation layer and electrically connected with the drain electrode of the second region through via-contact holes formed on the passivation layer.

The organic light emitting diode display may further include a pixel electrode formed on the passivation layer and electrically connected with the second connection wire.

Further, the gate electrode may be constituted by a doped or undoped amorphous silicon layer or a doped or undoped polysilicon layer.

According to the exemplary embodiment, an organic light emitting diode display can save process cost by excluding a heat treatment process for minimizing deformation such as the shrinkage of a substrate, or the like while implementing low-resistance wires.

DETAILED DESCRIPTION OF CERTAIN INVENTIVE EMBODIMENTS

Figure 1A:
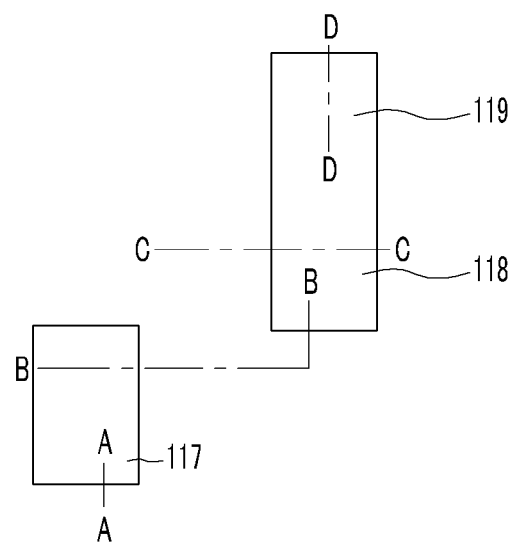
FIGS. 1A through 7B are diagrams for describing an embodiment of a method of manufacturing an embodiment of an organic light emitting diode display.

Details of the objects, technical configuration, and effects of certain embodiments will be described more fully hereinafter with reference to the accompanying drawings. In the drawings, the thickness of layers, films, panels, regions, and the like, may be exaggerated for clarity. Like elements generally refer to like reference numerals throughout the specification.

An active matrix type organic light emitting diode (AMOLED) typically includes thin film transistors. A bottom gate type thin film transistor typically crystallizes amorphous silicon after forming a gate pattern and, since the crystallization process is performed at high temperatures, typically 700° C. or higher, the substrate may shrink and as a result, the gate pattern may be misaligned.

In order to minimize deformation such as the shrinkage of the substrate, a pre-compaction process, which is a heat treatment process, may be performed before forming the gate pattern, but this may increase process cost.

Furthermore, since the resistance of the gate pattern is increased due to the heat treatment process for crystallization or activation in the crystallization process, it is difficult to implement low-resistance wires.

FIGS. 1A to 7B are diagrams for describing an embodiment of a method of manufacturing an embodiment of an organic light emitting diode display. In this case, FIGS. 1A, 2A, 3A, 4A, 5A, 6A, and 7A are plan views of an embodiment of an organic light emitting diode display and FIGS. 1B, 2B, 3B, 4B, 5B, 6B, and 7B are cross-sectional views taken along lines A-A, B-B, C-C, and D-D of FIGS. 1A, 2A, 3A, 4A, 5A, 6A, and 7A, respectively.

Figure 1B:
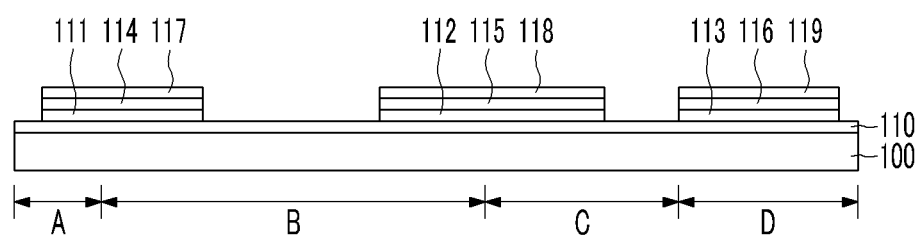

First, referring to FIGS. 1A and 1B, a transparent insulating substrate 100, which may be made of glass, quartz, sapphire, or the like, is provided and a buffer layer 110 having a predetermined thickness is formed by forming silicon oxide or silicon nitride on the surface of the transparent insulating substrate 100 by using a plasma-enhanced chemical vapor deposition (PECVD) method or the like. The buffer layer 110 may prevent impurities from being diffused into the transparent insulating substrate 100 during crystallization of an amorphous silicon layer formed by a subsequent process.

A gate electrode material layer (not shown) is formed on the buffer layer 110. The gate electrode material may be formed by using an amorphous silicon layer doped with n or p-type impurities, or by using an amorphous silicon layer undoped with the n or p-type impurities.

A gate insulator material layer (not shown) having a predetermined thickness is formed on the gate electrode material layer (not shown). The gate insulator material may be formed by silicon oxide, silicon nitride, or a laminated structure including the silicon oxide and the silicon nitride.

An amorphous silicon layer (not shown) having a predetermined thickness is deposited on the gate insulator material layer (not shown) and the amorphous silicon layer is crystallized by using excimer laser annealing (ELA), sequential lateral solidification (SLS), metal induced crystallization (MIC), metal induced lateral crystallization (MILC), super grain silicon (SGS) or the like to form a polysilicon layer (not shown).

The gate electrode material layer may also be crystallized while crystallizing the amorphous silicon layer (not shown).

The gate electrode material layer (not shown), the gate insulator material layer (not shown), and the polysilicon layer (not shown) may be patterned by a photolithography process.

Using patterning, a first gate electrode 111, a first gate insulator 114, and a first polysilicon pattern 117 are formed in a switching transistor region; a second gate electrode 112, a second gate insulator 115, and a second polysilicon pattern 118 are formed in a driving transistor region; and a lower capacitor electrode 113, a dielectric layer 116, and a first upper capacitor electrode 119 are formed in a capacitor region. The lower capacitor electrode 113 is electrically connected with the second gate electrode 112, and the second polysilicon pattern 118 and the first upper capacitor electrode 119 are also connected with each other.

In some embodiments, the gate electrode, the polysilicon pattern, and the capacitor of may be formed by using a first mask.

Figure 2A:
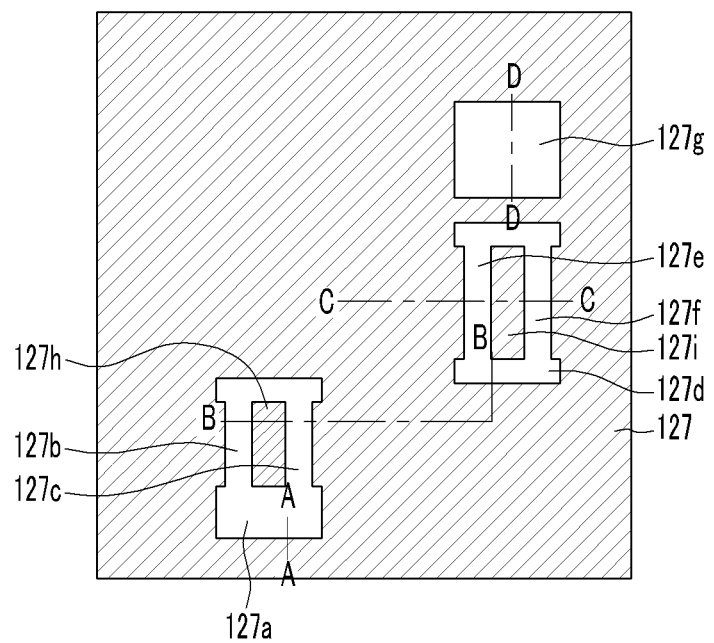
Figure 2B:
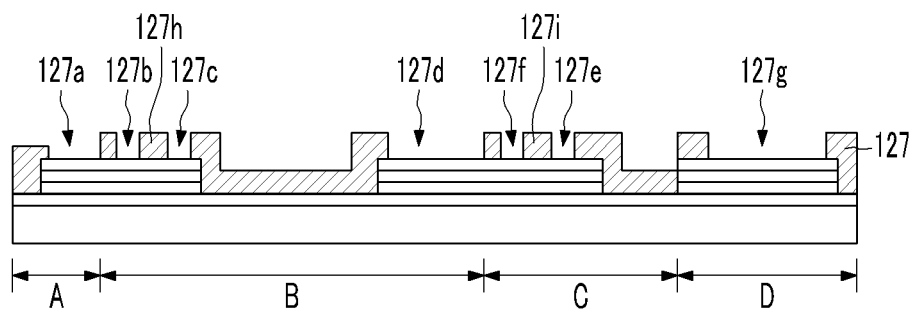

Next, referring to FIGS. 2A and 2B, an interlayer insulator 127 having a predetermined thickness is formed on the surface of the substrate 100 including the gate electrode, the polysilicon pattern, and the capacitor. In some embodiments, a silicon oxide layer or a silicon nitride layer may be used to form the interlayer insulator 127.

A plurality of via-holes 127a, 127b, 127c, 127d, 127e, 127f, and 127g are formed by etching the interlayer insulator 127 using a photolithography process. In some embodiments, the plurality of via-holes may be etched by using a second mask.

Etching stop layers 127h and 127i are formed by patterning the interlayer insulator. The etching stop layers 127h and 127i may be formed in predetermined regions of the first polysilicon pattern 117 and the second polysilicon pattern 118. In some embodiments, a polysilicon pattern below a region where the etching stop layer is formed may be defined as a channel region.

In some embodiments, the plurality of via-holes and the etching stop layers may be formed by using the second mask.

Figure 3A:
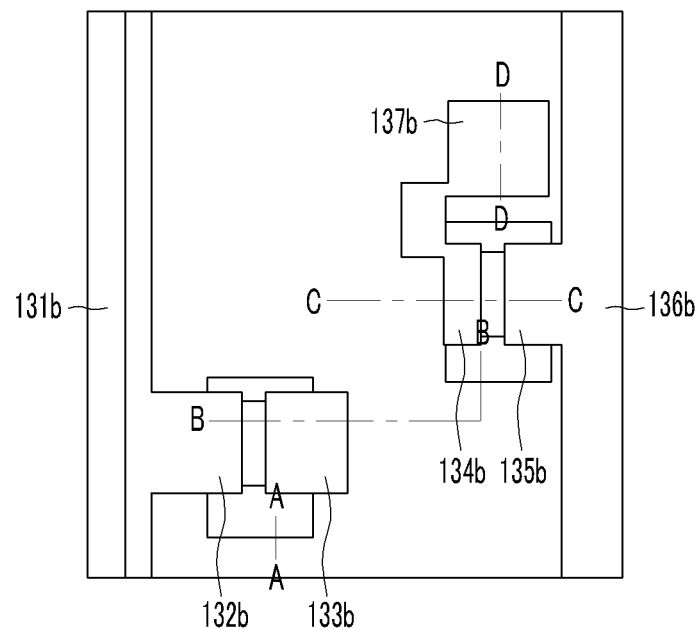
Figure 3B:
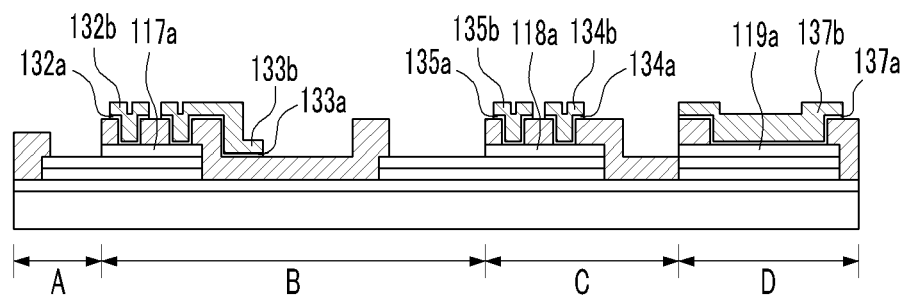

Next, referring to FIGS. 3A and 3B, a silicon layer (not shown) into which high-concentration impurities are injected may be formed on the interlayer insulator 127 including the plurality of via-holes 127a through 127g and a metallic layer (not shown) may be formed on the silicon layer injected with the high-concentration impurities.

The silicon layer injected with the high-concentration impurities (not shown), which may correspond to an ohmic contact layer defining a source/drain region, may be formed by being doped with n-type or p-type impurities. In some embodiments, the metallic layer (not shown) may be formed as a single layer made of a material selected from MO, W, MoW, AlNd, Ti, Cu, a Cu alloy, Al, an Al alloy, Ag, Ag alloy and the like, or may be formed as a laminated dual layer structure including MO, Cu, Al, and Ag, which are low-resistance materials. In other embodiments, the metallic layer may be formed by a laminated multiple layer structure of two layers or more, in order to reduce wire resistance.

Referring to FIGS. 3A and 3B, the silicon layer (not shown) injected with the high-concentration impurities and the metallic layer (not shown) are patterned by using the photolithography process.

Using patterning, an ohmic contact layer 132a and a first source electrode 132b and an ohmic contact layer 133a and a first drain electrode 133b are formed in the switching transistor region. An ohmic contact layer 135a and a second source electrode 135b and an ohmic contact layer 134a and a second drain electrode 134b are formed in the driving transistor region. A second upper capacitor electrode which is electrically connected with the first upper capacitor electrode 119a and includes a silicon layer pattern 137a injected with the high-concentration impurities and a metallic layer pattern 137b is formed in the capacitor region. In some embodiments, the second upper capacitor electrode may be electrically connected with the second drain electrode 134b of the driving thin film transistor.

A first semiconductor layer 117a is formed in the switching transistor region by patterning the first polysilicon pattern 117 and a second semiconductor layer 118a is formed in the driving transistor region by patterning the second polysilicon pattern 118. During this process, the first upper capacitor electrode 119a connected with the second polysilicon pattern 118 is separated.

A data line 131b that is electrically connected with the first source electrode 132b of the switching thin film transistor is formed and a power supply line 136b that is electrically connected with the second source electrode 135b of the driving thin film transistor is formed. In some embodiments, the data line 131b and the power supply line 136b may also be formed in a laminated structure including the silicon layer pattern injected with the high-concentration impurities, and a conductive layer pattern.

The etching stop layers 127h and 127i are formed in predetermined regions of the first polysilicon pattern 117 and the second polysilicon pattern 118. The etching stop layers 127h and 127i serve to prevent the polysilicon pattern (in particular, channel region) from being etched or damaged at the time of patterning the silicon layer injected with the high-concentration impurities and the metallic layer A process of forming the source/drain electrode and the ohmic contact layer by etching the silicon layer injected with the high-concentration impurities and the metallic layer by using the etching stop layers 127h and 127i is referred to as an etch stopper (E/S) etching process.

In some embodiments, the semiconductor layers 117a and 118a below the region where the etching stop layers are formed may be defined as the channel region.

In some embodiments, the source/drain electrodes 132b, 133b, 134b and 135b, the data line 131b, the power supply line 136b, and the semiconductor layers 117a and 118a may be formed by using a third mask.

Figure 4A:
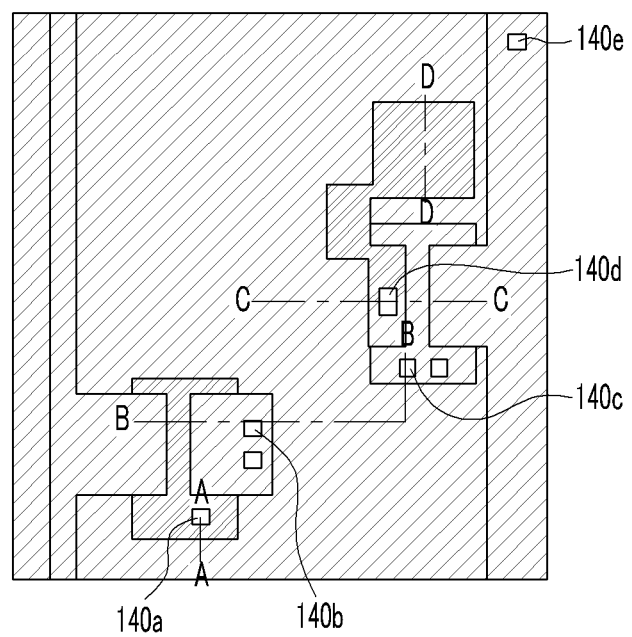
Figure 4B:
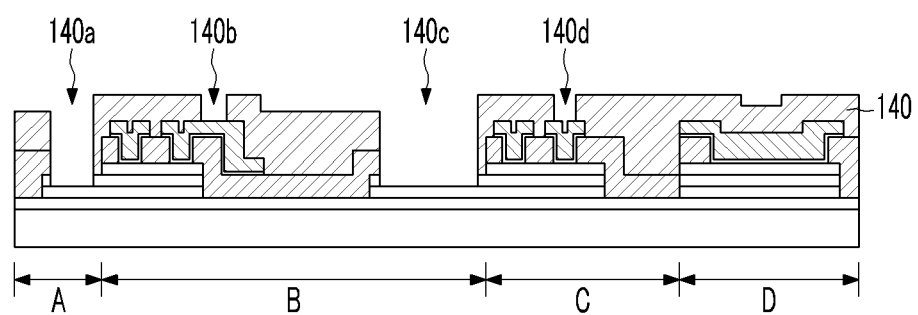

Referring to FIGS. 4A and 4B, a passivation layer 140 having a predetermined thickness is formed on the surface of the substrate including the source/drain electrode, the data line, and the power supply line. The passivation layer 140 may be formed by a single layer such as an organic layer and an inorganic layer, or a laminated structure including an inorganic layer and an organic layer.

A plurality of via-contact holes 140a, 140b, 140c, 140d, and 140e are formed by etching the passivation layer 140 by using a photolithography process. In some embodiments, the plurality of via-contact holes may be etched by using a fourth mask.

A predetermined region of the first gate insulator 114 is etched by the photolithography process to expose the first gate electrode 111 and a predetermined region of the second gate insulator 115 is etched to expose the second gate electrode 112. The first via-contact hole 140a exposes the first gate electrode 111 and the second via-contact hole 140c exposes the second gate electrode 112.

Figure 5A:
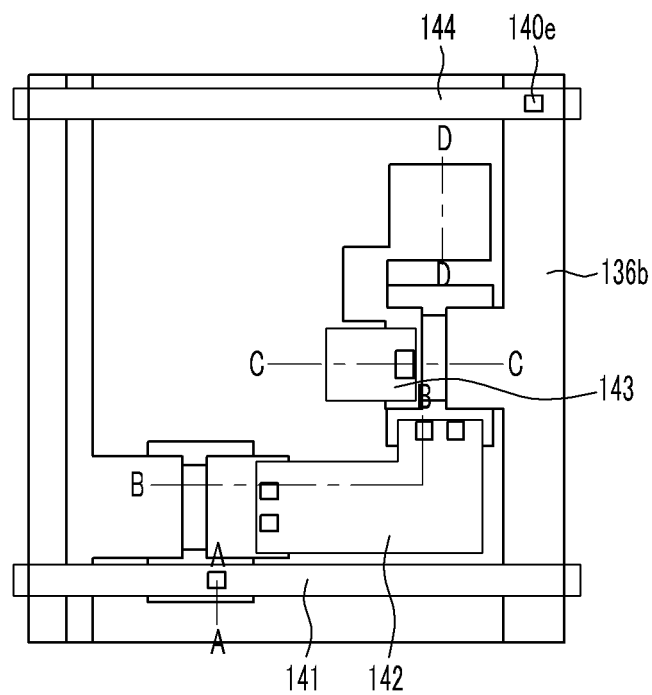
Figure 5B:
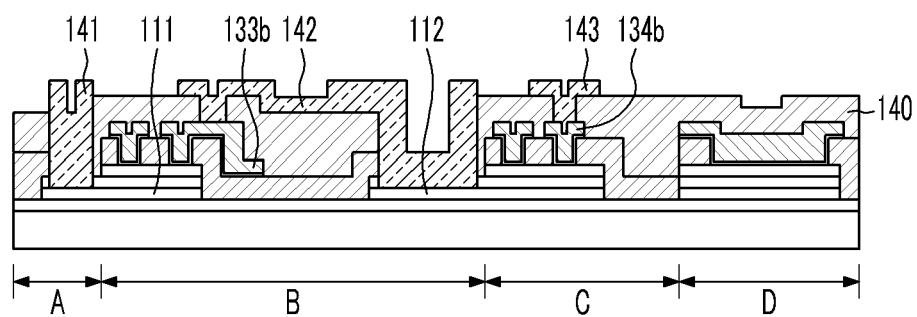

Referring to FIGS. 5A and 5B, a metallic layer (not shown) is formed on the surface of the substrate including the plurality of via-contact holes 140a, 140b, 140c, 140d, and 140e and the metallic layer is patterned through the photolithography process by using a fifth mask. In some embodiments, the metallic layer may be formed as a single layer made of a material selected from a group constituted by MO, W, MoW, AlNd, Ti, Cu, a Cu alloy, Al, an Al alloy, Ag, an Ag alloy and the like. In other embodiments, the metallic layer may be formed as one laminated dual layer structure including MO, Cu, Al, and Ag, which are low-resistance materials. In other embodiments, the metal layer may be formed as a laminated multiple layer structure of two layers or more in order to reduce wire resistance.

Using patterning, a gate line 141 that is electrically connected to the first gate electrode 111 of the switching thin film transistor is formed, a first connection wire 142 that electrically connects the second gate electrode 112 of the driving thin film transistor with the first drain electrode 133b of the switching thin film transistor is formed, and a second connection wire 143 that is electrically connected to the second drain electrode 134b of the driving thin film transistor is formed.

The gate line and the connection wires are formed and an auxiliary power supply line 144 may be formed. The auxiliary power supply line 144 may be electrically connected to a power supply line 136b through the via-contact hole 140e.

Figure 6A:
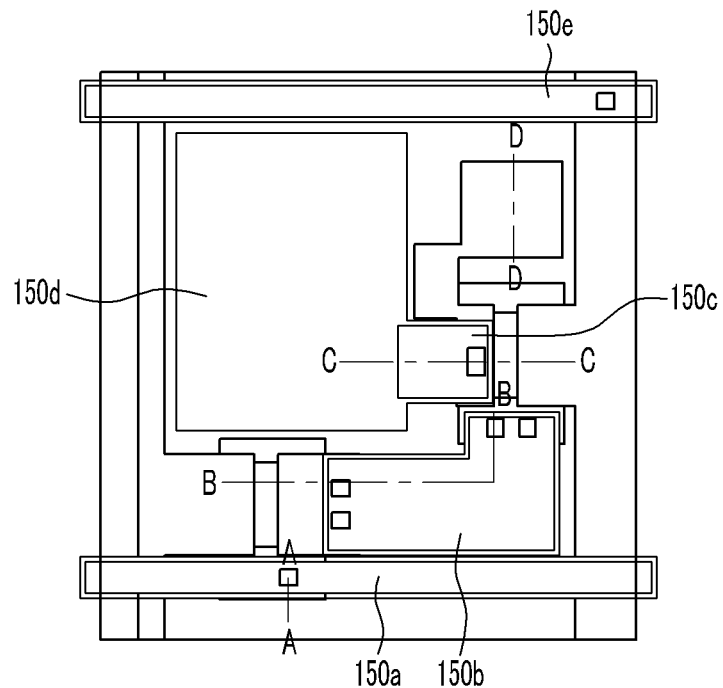
Figure 6B:
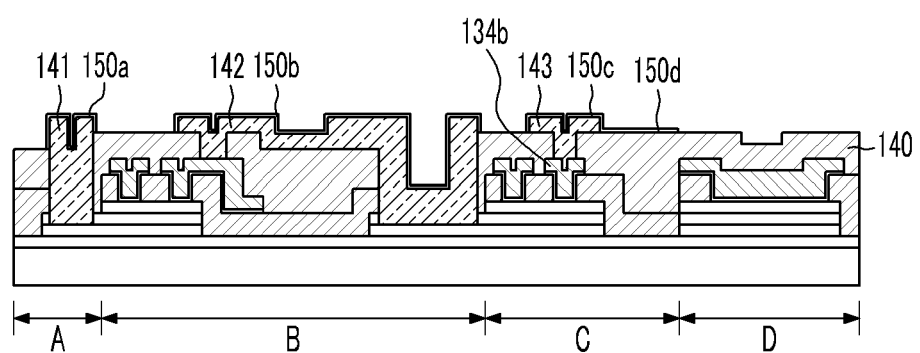

Referring to FIGS. 6A and 6B, a pixel electrode material layer (not shown) is formed on the surface of the substrate including the gate line, the connection wires, and the auxiliary power supply line and a pixel electrode 150d is formed by patterning the pixel electrode material layer through a photolithography process by using a sixth mask. The pixel electrode 150d is electrically connected with the second drain electrode 134b of the driving thin film transistor through the second connection wire 143.

In some embodiments, the pixel electrode material layer may be provided as a transparent electrode in bottom emission type OLEDs and as a reflective electrode in top emission type OLEDs. In embodiments where the pixel electrode is used as the transparent electrode, the pixel electrode may be formed with one of Indium Tin Oxide (ITO), Indium Zinc Oxide (IZO), Tin Oxide (TO), Zinc Oxide (ZnO) and the like. In embodiments where the pixel electrode is used as the reflective electrode, the pixel electrode may be formed by forming a reflective layer using one of Ag, Mg, Al, Pt, Pd, Au, Ni, Nd, Ir, Cr, and a compound thereof, and by laminating the transparent electrode with a material selected from the group constituted by Indium Tin Oxide (ITO), Indium Zinc Oxide (IZO), Tin Oxide (TO), Zinc Oxide (ZnO) and the like. In some embodiments, a transparent electrode material may be further formed below the reflective layer in the reflective electrode.

Using patterning, the gate line 141, the first connection wire 142, the second connection wire 143, and the common power supply line 144 are surrounded by the pixel electrode material layer patterns 150a, 150b, 150c, and 105e, respectively.

Figure 7A:
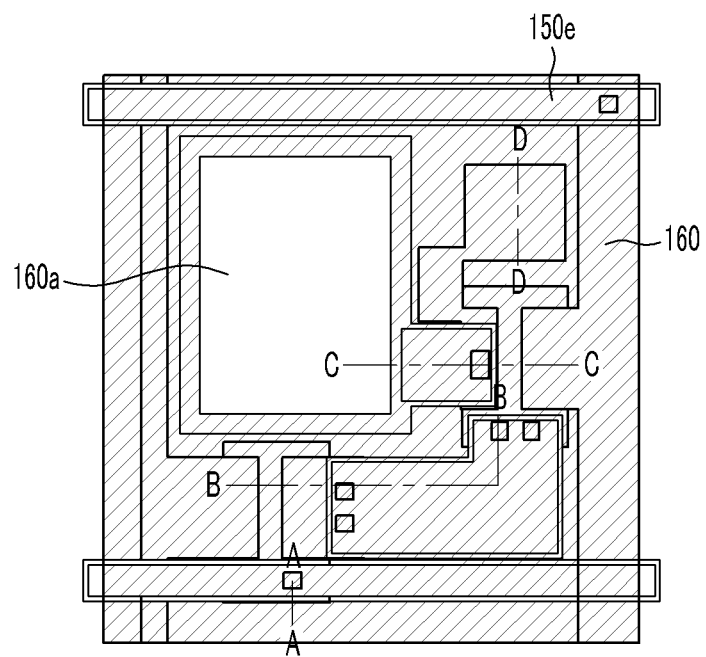
Figure 7B:
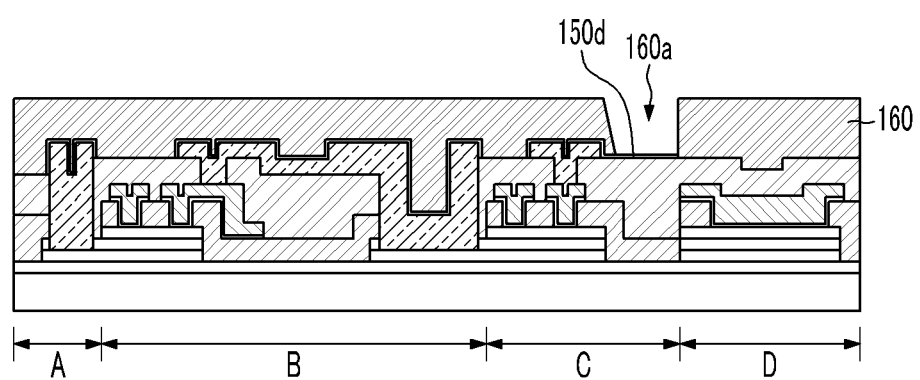

Referring to FIGS. 7A and 7B, a pixel defining layer 160 having a predetermined thickness is formed on the surface of the substrate including the pixel electrode 150d and the pixel electrode material layer patterns 150a, 150b, 150c, and 150e, and an opening 160a for exposing a predetermined portion of the pixel electrode 150d is formed by using a seventh mask so as to define a light emission region.

The pixel defining layer 160 may be made of a material selected from polyimide, benzocyclobutene series resin, spin on glass (SOG), acrylate, and the like.

An organic film layer (not shown) is formed on the pixel defining layer 160 including the opening 160a and a counter electrode (not shown) is formed on the surface of the substrate including the organic film layer so as to manufacture the organic light emitting diode display.

The organic film layer may be formed by a low-molecular deposition method or a laser thermal transfer method. The organic film layer may be formed by at least one thin film selected from an electron injection layer, an electron transport layer, a hole injection layer, a hole transport layer, a hole barrier layer, and an organic light emitting layer.

As a hole transporting material forming the hole transport layer, N,N'-di(naphthalene-1-yl)-N,N'-diphenyl-benzidine (a-NPB), N,N'-bis(3-methylphynyl)-N,N'-diphenyl[1,1'-biphenyl]-4,4'-diamine(TPD), and the like may be used. In addition, a film thickness of the hole transport layer may be in the range of about 10 to about 50 nm.

A dopant which can emit light by the combination of electrons and holes may be added to the hole transport layer in addition the hole transporting material. As the dopant, 4-(dicyanomethylene)-2-t-butyl-6-(1,1,7,7-tetramethyl-julolidyl-9-enyl)-4H-pyran (DCJTB), coumarin 6, Rubrene, DCM, DCJTB, perylene, quinacridone, and the like may be used and the content of about 0.1 to about 5 w % for a total weight of a material for forming the hole transport layer may be used. With the dopant added at the time of forming the hole transport layer, a light emitting color is controllable depending on the type and content of the dopant, and the thermal stability of the hole transport layer may be enhanced so as to extend the life-span of the device.

The hole injection layer may be formed by using a starbust armine-based compound, and the thickness of the hole injection layer may be in the range of about 30 to about 100 nm. Contact resistance between the counter electrode and the hole transport layer is reduced through the hole injection layer, and a hole transport capacity of an anode electrode is improved, thereby generally enhancing the characteristics of the device.

In some embodiments, the light emitting layer o may be formed using CBP(4,4'-bis(carbazol-9-yl)-biphenyl).

The light emitting layer may further contain a dopant which can emit light by the combination of electrons and holes like the hole transport layer. In some embodiments, the type and content of the dopant of the light emitting layer may be substantially the same as those of the hole transport layer and the film thickness of the light emitting layer may be in the range of about 10 to about 40 nm.

In some embodiments, the electron transport layer may be formed using an electron transporting material such as tris(8-quinolinolate)-aluminium (Almq 3). The electron transport layer may further contain a dopant which can emit the light by the combination of electrons-holes like the hole transport layer. In some embodiments, the type and content of the dopant of the electron transport layer may be substantially the same as those of the hole transport layer and the film thickness of the electron transport layer may be in the range of about 30 to about 100 nm.

A hole barrier layer (HBL) may be formed between the light emitting layer and the electron transport layer. The hole barrier layer serves to prevent excitons generated from a phosphorescent material from being moved to the electron transport layer or to prevent the holes from being moved to the electron transport layer. The hole barrier layer may be formed using BAlq.

The electron injection layer may be made of a material containing LiF and the thickness of the electron injection layer may be in the range of about 0.1 to about 10 nm.

In embodiments where the counter electrode is of a bottom emission type, the counter electrode is constituted by the reflective electrode. In such embodiments, the counter electrode may be made of a material selected from a group composed of Li, Ca, LiF/Ca, LiF/Al, Al, Mg, and an alloy of one of these materials. In embodiments where the counter electrode is of a top emission type, the counter electrode is configured in a structure in which a semi-transparent cathode type or a transparent cathode type is laminated after the semi-transparent cathode. The semi-transparent cathode type may be formed with a thickness in the range of about 5 to about 30 nm by using a material selected from a group composed of Li, Ca, LiF/Ca, LiF/Al, Al, Mg, and an Mg alloy. In embodiments where the transparent cathode type is formed after forming the semi-transparent cathode, the transparent cathode type may be formed by additionally laminating a layer using materials with a low-resistance characteristic such as for example, ITO, Indium Zinc Oxide (IZO), and the like after forming the semi-transparent cathode by using any a material composed of metal having a small work function, such as for example, Li, Ca, LiF/Ca, LiF/Al, Al, Mg, and a Mg alloy.

In some embodiments, after performing the heat treatment process for crystallizing the amorphous silicon layer, the source/drain electrodes, the data line, the power supply line, the gate line, the auxiliary power supply line, and the connection wires electrically connecting them with one other are formed.

In conventional methods, a gate pattern such as the gate line, or the like is typically formed before the heat treatment process, and the substrate may therefore shrink, and the gate pattern may thereby be misaligned. In order to minimize such deformation, such as the shrinkage of the substrate, or the like, a pre-compaction process, which is a gate heat treatment process, is typically performed. In some embodiments of this disclosure, since the gate line is formed after the heat treatment process for crystallization, the gate pattern is not misaligned even though a pre-compaction process is not performed.

In conventional OLEDs, even with a low-resistance metal used as the material for the layers, the wire resistance is increased by the heat treatment process, such that it is typically difficult to implement a low-resistance wire. In embodiments disclosed herein, since various wires of the thin film transistor are formed after the heat treatment process, it is possible to implement low-resistance wires.

Figure 8:
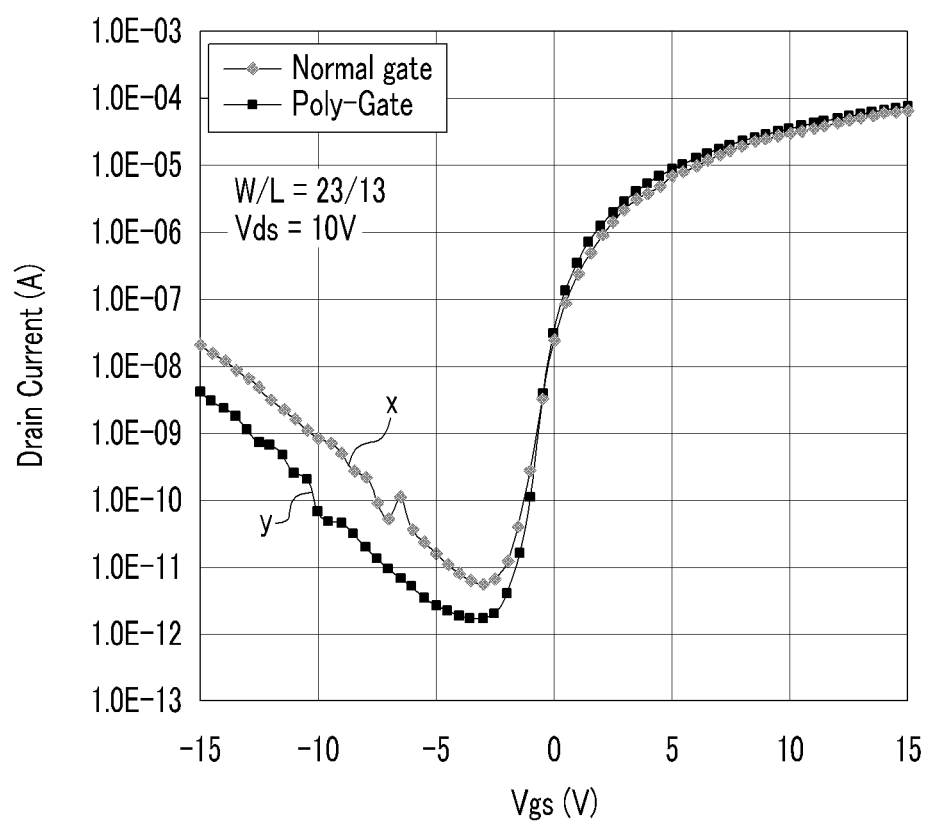
FIG. 8 is a graph illustrating TFT characteristics as a function of gate electrode material.

FIG. 8 is a graph illustrating TFT characteristics as a function of gate electrode material. In FIG. 8, x represents a gate electrode material consisting of MoW, which is a general metallic material, and y represents a a gate electrode material consisting of a polysilicon layer doped with n-type impurities, similar to the gate electrode of the embodiments described herein.

Referring to FIG. 8, the TFT characteristics (the Drain Current and Vgs) of y are equal to or better than the TFT characteristics of x.

In embodiments disclosed herein, by using a polysilicon layer doped with impurities instead of a metallic material as the gate electrode formed before the heat treatment process for crystallization, the TFT characteristics are not influenced and no misalignment occurs.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a substrate including a first region, a second region and a third region, wherein the third region includes a lower capacitor electrode, a dielectric layer, and a first upper capacitor electrode;
   a first gate electrode formed over the first region;
   a second gate electrode formed over the second region;
   a first gate insulator formed on the first gate electrode;
   a second gate insulator formed on the second gate electrode;
   a first semiconductor layer formed on the first gate insulator, the first semiconductor layer comprising a first channel region;
   a second semiconductor layer formed on the second gate insulator, the second semiconductor layer comprising a second channel region;
   an interlayer insulator formed over the substrate and over at least part of the first and second semiconductor layers;
   a first etching stop layer formed over the first channel region and surrounded by the interlayer insulator;
   a second etching stop layer formed over the second channel region and surrounded by the interlayer insulator;
   a first source electrode and a first drain electrode contacting the first semiconductor layer through the interlayer insulator;
   a second source electrode and a second drain electrode contacting the second semiconductor layer through the interlayer insulator;
   a passivation layer formed over at least part of the first source electrode, the first drain electrode, the second source electrode and the second drain electrode; and
   a gate line formed over the passivation layer and electrically connected with the first gate electrode through the passivation layer and further through the first gate insulator,
   wherein the first upper capacitor electrode is coplanar with the first semiconductor layer.

2. The organic light emitting diode display of claim 1, further comprising:
   a first connection wire formed on the passivation layer and electrically connected with the second gate electrode through the passivation layer and further through the second gate insulator.

3. The organic light emitting diode display of claim 2, wherein:
   the first connection wire is electrically connected with the first drain electrode.

4. The organic light emitting diode display of claim 3, further comprising:

pixel electrode material layer patterns formed on the gate line, the first connection wire, and a second connection wire, respectively.

5. The organic light emitting diode display of claim 1, further comprising:
a second connection wire formed on the passivation layer and electrically connected with the second drain electrode through the passivation layer.

6. The organic light emitting diode display of claim 5, further comprising:
a pixel electrode formed on the passivation layer and electrically connected with the second connection wire.

7. The organic light emitting diode display of claim 1, wherein:
each of the first and second gate electrodes comprises a doped or undoped amorphous silicon layer or a doped or undoped polysilicon layer.

8. The organic light emitting diode display of claim 1, wherein:
the lower capacitor electrode is electrically connected with the second gate electrode.

9. The organic light emitting diode display of claim 1, wherein:
the lower capacitor electrode comprises a doped or undoped amorphous silicon layer or a doped or undoped polysilicon layer.

10. The organic light emitting diode display of claim 1, further comprising:
a second upper capacitor electrode formed on the interlayer insulator and electrically connected with the first upper capacitor electrode.

11. The organic light emitting diode display of claim 10, wherein:
the second upper capacitor electrode comprises a lamination structure of a silicon layer pattern injected with high-concentration impurities and a metallic layer pattern.

* * * * *